Feb. 1, 1966 G. E. THERIAULT 3,233,122

PHASE DETECTOR

Filed Dec. 3, 1962 2 Sheets-Sheet 1

INVENTOR.

GERALD E. THERIAULT

BY Eugene M. Whitacre

Attorney

INVENTOR.
GERALD E. THERIAULT
BY Eugene M. Whitacre
ATTORNEY

United States Patent Office 3,233,122

Patented Feb. 1, 1966

3,233,122

PHASE DETECTOR

Gerald E. Theriault, Hopewell, N.J., assignor to Radio Corporation of America, a corporation of Delaware Filed Dec. 3, 1962, Ser. No. 241,701

7 Claims. (Cl. 307—88.5)

This invention relates to electrical circuit means for comparing the phase relationship between electrical signals, and more particularly to phase comparison circuits using semiconductor amplifier devices for deriving control voltages or currents indicative of phase relationships between two recurrent electrical signals.

There are many instances, particularly in electrical signalling systems, where there is a need for circuits capable of detecting the sense and magnitude of any phase difference between two electrical signals. In a common type of phase comparison circuit, a local controllable wave is compared in phase with a standard or fixed reference signal to develop a control voltage which may be used to adjust the local wave generator so as to bring it into synchronous frequency or phase relationship with the standard reference wave.

It is desirable in phase detector circuits that an error voltage be developed only when both signals to be compared are present. In other words, if one of the signals to be compared, such as the reference signal, is interrupted, substantially no error voltage should be produced, because this error voltage may be of a magnitude to cause the frequency of the local wave generator to be pulled so far off its desired frequency as to be outside the "pull in" range of the system when the reference signal is reapplied.

It is also desirable that phase detector circuits have a sufficiently high input impedance to effect a good impedance match with a relatively high impedance reference signal source.

It is an object of the present invention to provide an improved phase comparison circuit.

Another object of the present invention resides in the provision of an improved semiconductor phase detector system wherein the output error signal corresponds to substantially zero phase difference in the absence of one of the signals to be compared.

A further object of the present invention is to provide an improved semiconductor phase detector system having a high input impedance.

In accordance with the present invention, a phase detector circuit is provided with an insulated-gate field-effect semiconductor device including source, drain and gate electrodes. A first input circuit for a first of the signals to be compared is coupled between the source and drain electrodes and a second input circuit for the second of the signals to be compared is connected between the gate electrode and the first input circuit. A pair of impedance elements are connected between the source and drain electrodes, and the junction of the impedance elements is connected to the gate electrode. Charge storage means is connected in the source-drain circuit to develop an error voltage whose magnitude is a function of the sense and magnitude of any phase difference between the signals from the first and second input circuits.

In operation the source and drain electrodes are interchangeable, with the electrode which is instantaneously positive with respect to the other acting as the drain electrode. The gate electrode is referenced at a potential of intermediate value between the potentials of the source and drain electrodes such that the circuit operates to conduct source-drain current alternately in opposite directions through the channel whether or not signals are applied to the gate electrode. When signals are applied to the gate electrode the source-drain current flow in one direction will change relative to the current in the opposite direction as a function of the phase error of one signal relative to the other. The insulated-gate field-effect transistor exhibits a high input impedance thereby permitting its efficient coupling to high impedance signal sources.

The novel features which are considered to be characteristic of this invention are set forth with particularity in the appended claims. The invention itself, however, both as to its organization and method of operation as well as additional objects and advantages thereof will best be understood from the following description when read in connection with the accompanying drawings in which:

Figure 4:
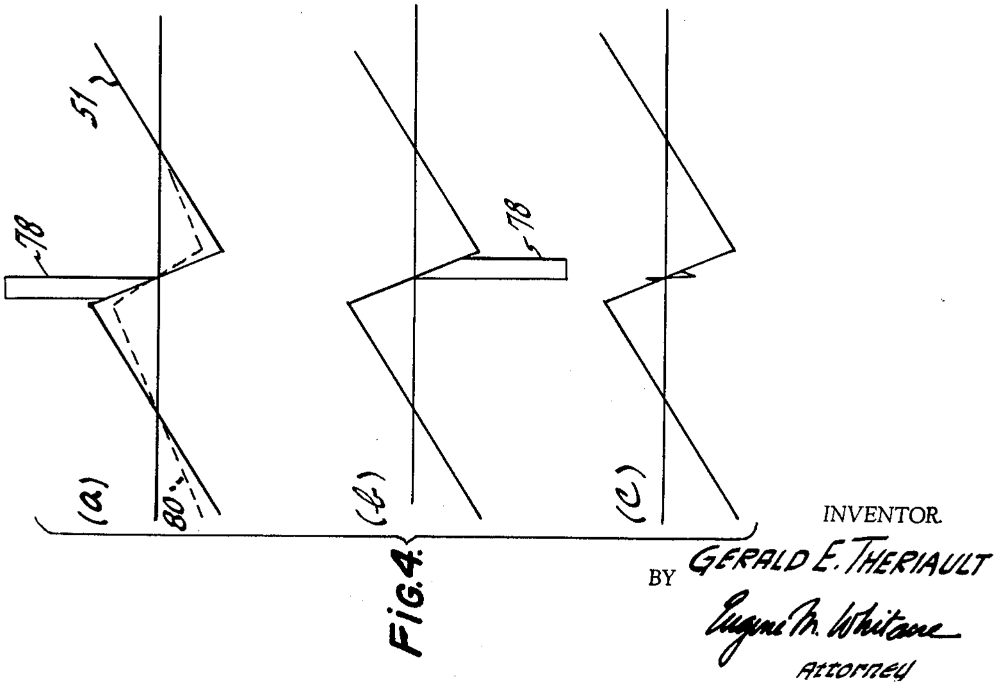
Figure 5:
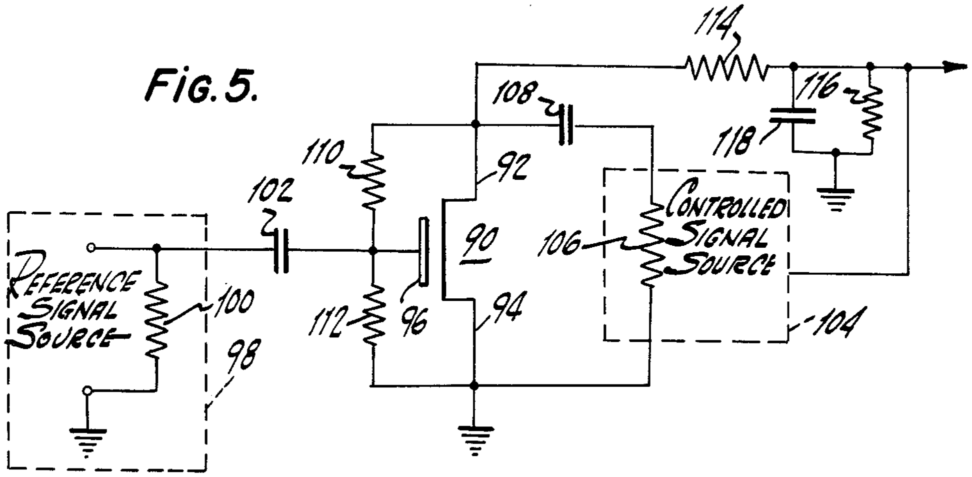

FIGURES 4*a*, 4*b* and 4*c* are graphical illustrations of exemplary signal relationships which may be encountered in the practice of present invention; and FIGURE 5 is a schematic circuit diagram of another embodiment of the phase comparison system of the invention.

Figure 1:
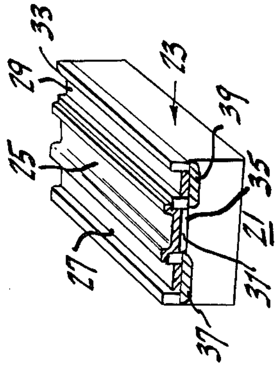
FIGURE 1 is a diagrammatic view of a field effect transistor of the type which may be used in circuits embodying the invention.

Referring now to the drawings and particularly to FIGURE 1, an insulated-gate field-effect transistor 21 which may be used with circuits embodying the invention includes a base or body 23 of semiconductor material. The base 23 may be either a single crystal or polycrystalline and may be of any one of the semiconductor materials used to prepare transistors in the semiconductor art. The transistor includes a conductive gate electrode 25, and a pair of electrodes 27 and 29 which may be interchangeably used as the source and drain electrodes. The gate electrode is separated from the body of semiconductor material by an insulating oxide layer 31.

The transistor of FIGURE 1 may be prepared by processing the device in the following manner. A single crystal body of P-type silicon of relatively high resistivity, such as 500 ohm-cm., has at least one surface cleaned to expose the body material. This may be achieved, for example, by etching the surface of the body with a chemical etchant to remove all of the disturbed material on the surface. Heavily doped silicon dioxide is then deposited by any suitable means as a layer portion 33 on selected areas of the clean surface on the body 23. For example, a uniform layer of doped silicon dioxide may be deposited on the crystal body 23 and the portion of the deposited layer overlaying the location where the insulating layer 31 is to be formed, is then removed. The deposited oxide may be removed by any suitable manner such as by a photoresist and acid etching technique. The thickness of the deposited oxide layer 33 is preferably between 1 and 5 microns.

The deposited silicon dioxide layer 33 contains a relatively high concentration of impurities (also referred to as dopant) which are N-type when present in silicon. Such impurities may for example be antimony, arsenic, or phosphorous.

The body 23 is then placed in a furnace and heated to about 900 to 1100° C. in a dry oxygen atmosphere and cooled. During the heating, the exposed surface portion of the silicon body 23 (under the later-applied gate electrode 25) is converted to silicon dioxide. Such converted material is referred to as thermally-grown silicon dioxide and comprises the oxide layer 31 as shown in the drawings. The converted material 31 is essentially pure silicon dioxide and has a high resistivity on the order of $10^{18}$ ohms-cm. A conducting channel 35 forms at the interface between the oxide layer 31 and the silicon body 23. During the same heating step, impurities from the deposited silicon dioxide layer 33 diffuse into the silicon as indicated at 37 and 39. The regions 37 and 39 are of low resistivity and provide a low resistance connection to the conducting channel 35.

Portions of the deposited oxide layer 33 are then removed to permit access to the diffused regions 37 and 39. Conductive electrodes are then selectively deposited on the diffused regions 37 and 39 to form the source and drain electrodes 27 and 29, and on the insulating layer 31 to form the gate electrode 25. The gate electrode 25 may be coextensive with the layer 31 of grown silicon dioxide, or may overlie only a portion of the conducting channel 35. If desired the gate may be displaced laterally to a position closer to one of the source and drain regions 37 and 39. In the embodiment described, the channel 35 is about 0.0005 inch in dimension between the diffused areas 37 and 39 and is about 0.05 inch transversely thereto. The high resistivity layer 31 of silicon dioxide is about 2700 A. thick. Such a device has an input resistance of about $10^{14}$ ohms, as measured between the source and gate electrodes.

Figure 2:
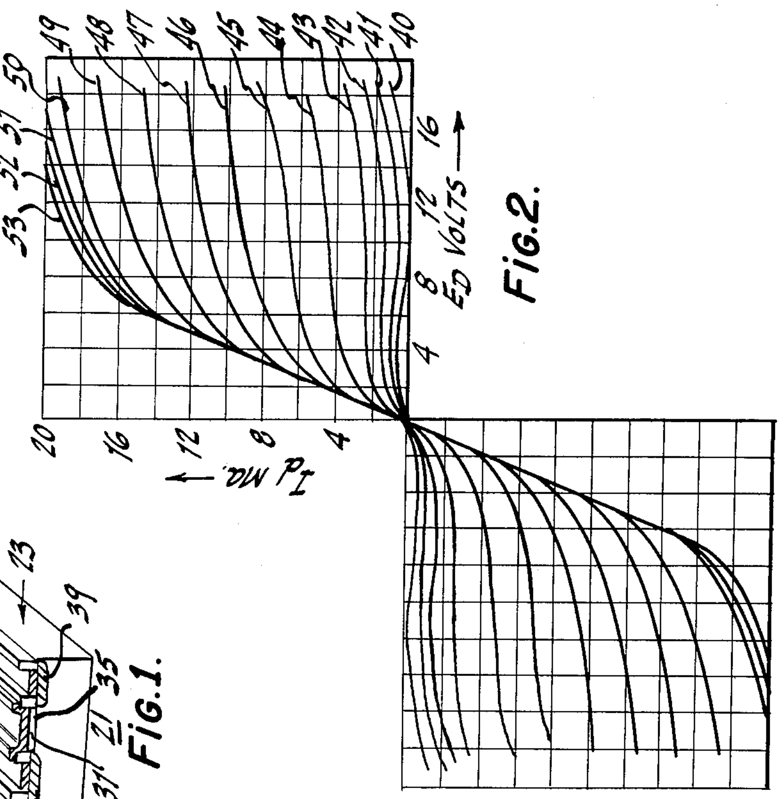
FIGURE 2 is a graph illustrating the source voltage vs. source current characteristics of the transistor shown in FIGURE 1 for various values of gate bias voltage.

FIGURE 2 is a family of curves 40–53 illustrating the drain current vs. drain voltage characteristic of the transistor of FIGURE 1 for different values of gate-to-source voltage. It will be noted that the curves 50–53 representative of high drain current and the curves 40–43 representative of relatively low drain current are relatively closely spaced, whereas the intermediate curves 43–50 are relatively uniformly spaced. The equal spacing of the curves for equal gate-to-source voltage increments is indicative of a linear operating region for the transistor.

It will be noted from the curves in the first and third quadrants that the transistor exhibits symmetrical characteristics. The electrodes 27 and 29 may interchangeably operate as source or drain. The curves in the first quadrant are representative of the conditions when one of the electrodes 27 and 29 is the drain and the curves in the third quadrant represent the conditions when the other of the electrodes is the drain. The one of the source and drain electrodes to which an instantaneously positive voltage is applied relative to the other of these electrodes is considered to be the drain electrode, and the gate bias is referenced against the electrode operating as the source.

A feature of an insulated-gate field effect transistor is that the zero bias characteristic can be at any one of the curves 40–53 shown in FIGURE 2 with the curves above the zero bias curve representing positive gate voltage relative to the source and the curves below the zero bias point representing negative gate voltages relative to the source. The location of the zero bias curve can be selected by control of the processing of the transistor during its manufacture. For example by controlling the time and/or temperature of the step of the process when the silicon dioxide layer 31 is grown, the number of free charge carriers in the device can be controlled. The longer the transistor is baked, and the higher the temperature, in a dry oxygen atmosphere, the more the drain current for a given amount of drain voltage for zero bias between the source and gate electrodes. By way of example, to establish the curve 47 as the zero bias curve, during the step which produces the silicon dioxide layer 31, the transistor was baked for two hours at 900° C. in an atmosphere of dry oxygen. If the temperature, or time of baking, or both are increased, the zero bias curve will correspond to one of the curves 48–53. By decreasing the temperature or time, or both, in the baking cycle the zero bias curve will occur for lower values of drain current such as for example one of the curves 40–46.

Figure 3:
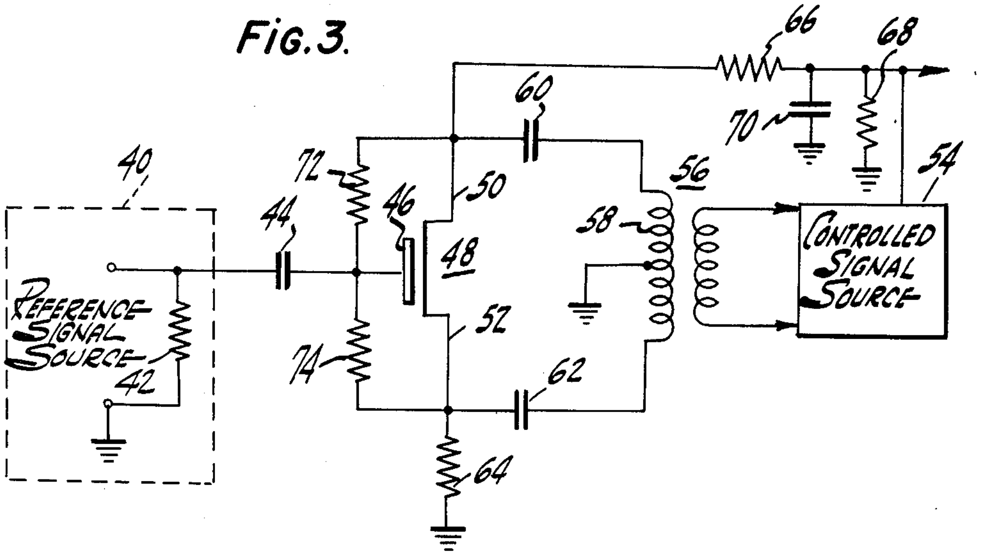
FIGURE 3 is a schematic circuit diagram of a phase detector circuit embodying the invention.

In the schematic circuit diagram of FIGURE 3, a reference signal source 40, which may for example comprise a source of synchronizing pulses derived from a reference signal source has an internal source impedance represented by the resistor 42. The reference signal source 40 is coupled through a capacitor 44 to the gate electrode 46 of an insulated gate field effect type transistor 48 which may be of the type described in connection with FIGURES 1 and 2. In addition to the gate electrode 46, the transistor 48 includes electrodes 50 and 52, either of which may serve as the source or drain electrode depending upon the relative polarity of the electrodes with respect to each other. For example, if the electrode 50 is positive with respect to the electrode 52, it operates as the drain, but if this electrode is negative with respect to the electrode 52, it operates as the source electrode.

A signal from a second or controlled signal source 54 whose frequency and phase are to be compared with that of the reference signal from the source 40 is coupled through a transformer 56 to the transistor 48. The secondary winding 58 of the transformer 56 has a grounded center tap and a pair of end terminals which are respectively connected through the charge storage capacitors 60 and 62 to the electrodes 50 and 52 of the transistor 48. The electrode 52 is connected to ground through a resistor 64, and an AFC or APC (automatic frequency control or automatic phase control) voltage is derived from the electrode 50 and filtered through a resistance-capacitance network including resistors 66 and 68 and a capacitor 70. A pair of resistors 72 and 74 are connected in series between the electrodes 50 and 52. The junction of the resistors 72 and 74 is connected to the gate electrode 46. The resistors 72 and 74 are equal where the transistor 48 exhibits symmetrical characteristics as does the device of FIGURES 1 and 2. If the device does not exhibit symmetrical characteristics the resistances of the resistors 72 and 74 can be unbalanced in a manner so that in the absence of signals from the source 40, the current in one direction through the transistor equals the current in the other direction therethrough. To illustrate, the transistor 48 may be unbalanced due to an offset gate electrode, or the like, such that with equal resistors 72 and 74 the electrode 50, when operating as the drain conducts more current than the electrode 52 does when it operates as the drain. To adjust the two opposite currents to about the same value, in the absence of signals from the source 40, the resistor 72 may be made larger than the resistor 74. Alternatively with an unsymmetrical transistor and equal resistance bias resistors 72 and 74, the centertap of the secondary winding 58 can be changed so that with no signal from the source 40 no error voltage is produced.

In describing the operation of the phase detector circuit of FIGURE 3, it will be asumed that the transistor 48 exhibits a zero gate bias characteristic represented by the curve 43 of FIGURE 2. The curves 44–53 represent equal increments of progressively more positive gate voltage, and the curves 42–40 represent equal increments of progressively more negative voltage. Furthermore it will be presumed that the signal voltage from the controlled signal source 54 is a recurrent wave such as a saw tooth or sine wave voltage, and the phase and frequency of the signal from the controlled signal source can be controlled by a direct voltage developed across the resistor 68. During the time when the voltage from the controlled signal source 54 drives the electrode 50 in the positive polarity direction, and the electrode 52 an equal amount in the negative polarity direction with respect to ground, the electrode 50 acts as the drain and the electrode 52 acts as the source. The gate electrode is maintained at substantially ground potential by the resistors 72 and 74 which are of equal valve. Thus the gate electrode is at a positive potential with respect to the source electrode 52. Referring to FIGURE 2, it will be seen that the transistor 48 is biased into conduction with conventional current flowing counterclockwise around the loop including the secondary winding 58, the capacitors 60 and 62 and the source-to-drain path of the transistor 48. As an illustration, if the instantaneous source-to-drain voltage is 10 volts, the gate electrode will be biased 5 volts positive with respect to the source electrode 50. Assuming 1 volt increments between the curves 40–53, the transistor will be operating on the curve 48 with a source-to-drain voltage of 10 volts and an instantaneous drain current of approximately 13 ma.

During the time when the voltage from the controlled signal source 54 drives the electrode 50 in the negative polarity direction, and the electrode 52 an equal amount in the positive polarity direction with respect to ground, the electrode 52 acts as the drain and the electrode 50 acts as the source. As mentioned before, the gate electrode is maintained at substantially ground potential by the resistors 72 and 74, and hence the gate electrode is maintained positive with respect to the source electrode 50. Referring to FIGURE 2, it will be seen that the transistor 48 is biased into conduction with conventional current flowing clockwise around the loop including the secondary winding 58, the capacitors 60 and 62 and the source-to-drain path of the transistor 48. As an illustration, if the instantaneous source-to-drain voltage is 10 volts the gate electrode will be biased 5 volts positive with respect to the source electrode 52. Assuming one volt increments between the curves 40–53, the transistor will be operating on the curve 48 in the third quadrant with an instantaneous drain current of approximately 13 ma.

Since opposite half cycles of the signal from the controlled signal source 54 produce equal and opposite currents through the transistor 48, no residual charge is developed on the capacitors 60 and 62 and thus no error voltage is present for application to the controlled signal source 54.

If a signal from the reference signal source 40 is applied to the gate electrode 46, and the controlled signal source does not bear the proper phase relation to the reference signal, the currents in the opposite directions through the transistor will not be equal and the capacitor 60 will charge up to a plus or minus direct error voltage depending on the phase of the two signals. The error voltage is developed across the resistors 66 and 68 which are effectively connected in parallel with the capacitor 60. If desired a bias source may be provided in connection with the resistors 66 and 68, so that the error voltage will be either negative or positive at reference phase condition and become more negative or less negative, or more positive or less positive, depending on the phase error between the controlled signal source 54 and the reference signal source 40.

Reference is made to the waveforms of FIGURE 4 for a further explanation of how the error voltage is produced. In the waveforms of FIGURE 4 the signal from the controlled signal source is a sawtooth waveform and that from the reference signal source is a synchronizing pulse for controlling the phase and frequency of the sawtooth wave. To this end the phase and frequency of the signal from the sawtooth generator 54 is adapted for control by a D.-C. voltage which is derived as a result of the phase comparison between the synchronizing signals and the sawtooth wave.

The synchronizing pulses 78 from the source 40 are of a polarity such that the pulse excursions are in the positive direction. These positive synchronizing pulses are coupled through the capacitor 44 to drive the gate electrode 46 in a direction to increase the current flow between the source and drain electrodes 50 and 52. During the intervals between synchronizing pulses, the capacitor 44 discharges through the resistors 72 and 74 so that a small net D.-C. voltage due to the synchronizing pulses will be produced at the gate electrode. This voltage does not contribute to the error voltage developed at the electrode 50 but only affects the amplitude of the current flowing between the source and drain electrodes to reduce the current therebetween as indicated by the curve 80 of FIGURE 4*a*.

If during the synchronizing signal period, the operating electrode 50, in response to the saw tooth signal, is positively polarized with respect to the electrode 52, electrode 50 acts as a drain and electrode 52 acts as a source electrode. Under the conditions shown in FIGURE 4*a* the gate electrode is driven positively by the synchronizing signal during this interval, the drain current 51 is increased. With reference to FIGURE 2 the synchronizing pulse drives the transistor from operation on the curve 48, for example, to operation on the curve 53 for example. However during the portion of the cycle following the synchronizing signal when the electrode 52 operates as the drain, current is about the same as it would be in the absence of the synchronizing signal. Thus the transistor conduction is not the same for the positive and negative excursions of the sawtooth wave and hence, a charge builds up on the capacitor 60 which causes the electrode 50 to become negative with respect to ground.

The graph of FIGURE 4*b* shows the condition where the potential of the operating electrode 50 is negative with respect to the electrode 52 during the occurrence of the synchronizing pulse. Under these conditions greater current flows when the electrode 52 operates as the drain, and the capacitor 60 charges up to make the electrode 50 positive with respect to ground. The direct voltage appearing at the electrode 50 is applied to the sawtooth generator (controlled signal source 54) to correct its phase to the condition shown in FIGURE 4C.

As shown in FIGURE 4C the synchronizing pulse occurs during the time that the sawtooth wave traverses the zero D.-C. axis. Very little source or drain voltage is present, and the amount of current drawn during the sync pulse interval will be relatively small and any increase of current will be divided equally between the clockwise direction and counterclockwise directions of the flow. Thus the capacitors 60 and 62 will not charge up and no error voltage will be developed at the electrode 50. This means that a substantially zero error voltage will be applied to the controlled signal source 54. The automatic frequency and phase control type of operation is provided by virtue of the basic phase detecting and comparing action of the circuit including the field effect transistor 48. It will be noted that the circuit described is extremely simple involving a relatively small number of component parts, and that no separate biasing circuits other than the signals supplied to the transistor are required for proper operation.

Furthermore it will be noted that, in the absence of the synchronizing signal, the currents flowing around the loop between the source and drain electrodes will be equal and opposite so that no error voltage is developed. As mentioned above this feature provides the advantage of permitting the controlled oscillator to oscillate at its natural frequency without being pulled by an erroneous phase error signal.

The schematic circuit diagram of FIGURE 5 shows an unbalanced circuit of a phase detector circuit embodying the invention. In the circuit of FIGURE 5 the insulated gate field effect transistor 90 includes operating electrodes 92 and 94 and a gate electrode 96. Signals from a reference signal source 98 having an internal resistance represented by the resistor 100 are applied through a coupling capacitor 102 to the gate electrode 96. Signals from a controlled signal source 104 having an internal resistance 106 are applied through a capacitor 108 between the operating electrodes 92 and 94 respectively, the electrode 94 being at ground potential. A pair of resistors 110 and 112 are connected between the operating electrodes 92 and 94, with the junction thereof coupled to the gate electrode 96. Error voltage representative of the phase difference between the reference signal and the control signal are developed at the electrode 92 and applied through a low pass filter including the resistors 114–116 and a capacitor 118 to the controlled signal source as described hereinabove in connection with FIGURE 3.

The impedance of the controlled signal source should be small relative to the impedance looking into the electrode 92 operating as either a source or a drain electrode to minimize the transistor loading on the controlled signal source. By way of example, the circuit of FIGURE 5 was found to exhibit acceptable operation when the impedance of the controlled signal source was about 10 ohms. In like manner, the impedance of the reference signal source 98 should be low relative to the impedance looking into the gate electrode 96 at the desired frequency of operation. It was found that a reference signal source 98 impedance of about 2700 ohms was acceptable.

What is claimed is:

1. In an electrical system including a first source of signals and a second source of signals, a phase detector comprising the combination of
   - an insulated-gate field-effect transistor having a bidirectional current path of controllable conductivity and a gate control electrode,
   - means coupling said first source of signals to produce bidirectional current flow in said transistor, and
   - circuit means interconnecting said bidirectional current path, said gate control electrode and said second source of signals for controlling, in response to signals from said second source, the relative magnitude of the current in one direction through said transistor as compared to current in the other direction through said transistor.

2. A phase detector circuit comprising
   - a first source of signals and a second source of signals,
   - an insulated-gate field-effect transistor having a gate electrode and a pair of operating electrodes interchangeably operating as source and drain electrodes depending on the instantaneous potentials applied thereto,
   - first impedance means connected between one of said operating electrodes and said gate electrode,
   - second impedance means connected between the other of said operating electrodes and said gate electrode,
   - means for applying signals from said first source of signals between said operating electrodes in balanced relation with respect to a point of reference potential,
   - means for applying signals from said second source of signals between said gate electrode and said point of reference potential, and
   - charge storage means connected with said operating electrodes to derive a voltage whose magnitude and polarity is a function of the phase relation of signals from said first and second sources of signals.

3. An electrical circuit including
   - a semiconductor device having an insulated control electrode and a pair of operating electrodes said semiconductor device exhibiting bidirectional conductivity between said operating electrodes which conductivity is controllable as a function of the potential applied to said control electrode,
   - first circuit means interconnecting said control electrode and said operating electrodes to symmetrically reference the potential of said control electrode relative to said operating electrodes,
   - a first source of signals coupled to a point of reference potential; second circuit means for coupling said first source of signals in balanced relation between said operating electrodes,
   - a second source of signals; third circuit means coupling said second source of signals between said control electrode and said point of reference potential by a path exclusive of said first circuit means, and
   - means coupled to at least one of said operating electrodes for deriving a voltage that is a function of the phase relation of said signals from said first and second sources of signal.

4. An electrical circuit comprising
   - a first source of signals and a second source of signals,
   - an insulated-gate field-effect transistor having a gate electrode and a pair of operating electrodes interchangeably operating as source and drain electrodes depending on the instantaneous potentials applied thereto,
   - a first resistor connected between one of said operating electrodes and said gate electrode,
   - a second resistor connected between the other of said operating electrodes and said gate electrode,
   - means including a charge storage capacitor for applying signals from said first source of signals between said operating electrodes,
   - means for applying signals from said second source of signals between said gate electrode and said first source of signals, and
   - output circuit means connected with one of said operating electrodes to derive a voltage as a function of the phase relation of signals from said first and second sources of signals.

5. A phase detector circuit comprising
   - a first source of signals and a second source of signals,
   - an insulated-gate field-effect transistor having a gate electrode and a pair of operating electrodes interchangeably operating as source and drain electrodes depending on the instantaneous potentials applied thereto,
   - a pair of resistors connected in series between said operating electrodes,
   - means connecting said gate electrode to the junction of said pair of resistors,
   - charge storage means,
   - means including said charge storage means for applying signals from said first source of signals between said operating electrodes,
   - means for applying signals from said second source of signals between said gate electrode and a point of reference potential,
   - means connecting one of said operating electrodes to said point of reference potential, and
   - output circuit means connected to the other of said operating electrodes.

6. A phase detector circuit as defined in claim 5 wherein said pair of resistors are of equal value.

7. A phase detector circuit comprising
   - a first source of signals and a second source of signals,
   - an insulated-gate field-effect transistor having a gate electrode and a pair of operating electrodes interchangeably operating as source and drain electrodes depending on the instantaneous potentials applied thereto,
   - a pair of resistors connected in series between said operating electrodes,
   - means connecting said gate electrode to the junction of said pair of resistors,
   - means including a pair of capacitors for applying signals from said first source of signals between said operating electrodes in balanced relation with respect to a point of reference potential,
   - means for applying signals from said second source of signals between said gate electrode and a point of reference potential, and
   - resistive circuit means connecting each of said operating electrodes to said point of reference potential whereby a voltage is developed across said resistive circuit means whose magnitude and polarity is a function of the phase relation of signals from said first and second source of signals.

References Cited by the Examiner

UNITED STATES PATENTS

| | | | |
|---|---|---|---|
| 2,799,784 | 7/1957 | Harris et al. | 307—88.5 |
| 2,900,506 | 8/1959 | Whetter | 329—122 |
| 3,131,312 | 4/1964 | Putzrath | 307—88.5 |

JOHN W. HUCKERT, *Primary Examiner.*

DAVID J. GALVIN, *Examiner.*